United States Patent
Liebhard

(10) Patent No.: US 6,486,537 B1
(45) Date of Patent: Nov. 26, 2002

(54) SEMICONDUCTOR PACKAGE WITH WARPAGE RESISTANT SUBSTRATE

(75) Inventor: Markus K. Liebhard, Gilbert, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 09/812,426

(22) Filed: Mar. 19, 2001

(51) Int. Cl.[7] .................................................. H01L 23/495
(52) U.S. Cl. .................... 257/667; 257/666; 257/669; 257/787; 257/737; 257/780; 257/738; 257/701; 257/713
(58) Field of Search .................... 257/667, 669, 257/787, 701, 737, 780, 713, 738, 668, 666, 707

(56) References Cited

U.S. PATENT DOCUMENTS

| | | | |
|---|---|---|---|
| 4,530,152 A | 7/1985 | Roche et al. ............... 29/588 |
| 4,707,724 A | 11/1987 | Suzuki et al. ............... 357/71 |
| 4,756,080 A | 7/1988 | Thorp, Jr. et al. ............ 29/827 |
| 5,157,480 A | 10/1992 | McShane et al. ............. 357/74 |
| 5,200,362 A | 4/1993 | Lin et al. ................... 437/207 |
| 5,273,938 A | 12/1993 | Lin et al. ................... 437/207 |
| 5,474,958 A | 12/1995 | Djennas et al. ............. 437/211 |
| 5,604,376 A | 2/1997 | Hamburgen et al. ......... 257/676 |
| 5,620,928 A | 4/1997 | Lee et al. ................... 438/118 |
| 5,652,185 A * | 7/1997 | Lee ............................ 437/219 |
| 5,835,355 A | 11/1998 | Dordi ........................ 361/760 |
| 5,859,471 A | 1/1999 | Kuraishi et al. ............ 257/666 |
| 5,866,949 A * | 2/1999 | Schueller .................... 257/778 |
| 5,894,108 A | 4/1999 | Mostafazadeh et al. ..... 174/52.4 |
| 5,903,052 A | 5/1999 | Chen et al. ................. 257/706 |
| 6,013,948 A | 1/2000 | Akram et al. ............... 257/698 |
| 6,034,423 A | 3/2000 | Mostafazadeh et al. ..... 257/691 |
| 6,034,427 A | 3/2000 | Lan et al. ................... 257/698 |
| 6,060,778 A * | 5/2000 | Jeong et al. ................. 257/710 |
| 6,081,037 A * | 6/2000 | Lee et al. ................... 257/778 |
| 6,099,677 A * | 8/2000 | Logothetis et al. ......... 156/253 |
| 6,107,689 A * | 8/2000 | Kozono ...................... 257/778 |
| 6,122,171 A * | 9/2000 | Akram et al. ............... 361/704 |
| 6,127,833 A | 10/2000 | Wu et al. .................... 324/755 |
| 6,172,419 B1 | 1/2001 | Kinsman ..................... 257/737 |
| 6,303,998 B1 * | 10/2001 | Murayama ................... 257/778 |

* cited by examiner

Primary Examiner—Tom Thomas
Assistant Examiner—Nitin Parekh
(74) Attorney, Agent, or Firm—Skjerven Morrill LLP; James E. Parsons

(57) ABSTRACT

A semiconductor package and a method for fabricating a semiconductor package are disclosed. The semiconductor package includes semiconductor chip attached to a circuit board that includes at least one lateral slot formed through the circuit board. Provision of the slot reduces stresses in the circuit board that are manifested by warpage. The semiconductor chip may be positioned in a central aperture of the circuit board and held therein by hardened encapsulant material.

23 Claims, 6 Drawing Sheets

SEMICONDUCTOR PACKAGE WITH WARPAGE RESISTANT SUBSTRATE

BACKGROUND

1. Field of the Invention

The present invention relates to a semiconductor package and a method for fabricating a semiconductor package.

2. Description of the Related Art

A typical ball grid array (BGA) semiconductor package includes a semiconductor chip mounted on an upper surface of an insulative, printed circuit board substrate. The substrate may be made of a glass fiber filled organic laminate, such as FR4 board, FR5 board, or BT board, and has interconnected, conductive circuit patterns on upper and lower surfaces thereof. A hardened encapsulant material covers the chip, the upper surface of the substrate, and electrical conductors, such as bond wires, that extend between the chip and the circuit patterns on the upper surface of the substrate. Conductive balls or other input/output terminals are formed on the circuit patterns of the lower surface of the substrate.

Consistent with a trend toward smaller and thinner packages, the semiconductor chip is sometimes mounted within a central aperture of the substrate. The chip is supported in the aperture by the hardened encapsulant material. One difficulty with such a package, however, is warpage of the substrate due in part to temperature cycling during the manufacturing process and differences in the thermal expansion properties of the various materials of the package, e.g., differences in the thermal expansion properties of the substrate and encapsulant material. The warpage is particularly manifest at the corners of the package. Where the package substrate is warped, the conductive balls or other input/output terminals on the lower surface of the substrate are uneven. This causes difficulty when mounting the package on a motherboard. The magnitude of the warpage tends to increase as package size increases, and thus tends to impose an upper limit on the package size.

SUMMARY OF THE INVENTION

The present invention includes, among other things, a substrate for a semiconductor package that is resistant to the warpage problem mentioned above, a method of making such a package, and a circuit board strip for making a plurality of the packages in a parallel process.

For example, one embodiment of a semiconductor package in accordance with the present invention includes a semiconductor chip attached to a circuit board. For instance, the chip may be provided within a central aperture of the circuit board, and held therein by hardened encapsulant material. Circuit patterns are provided on one or both of two opposing major surfaces of the circuit board. The chip is electrically connected to the circuit patterns of one of the surfaces through bond wires, leads, or the like. The circuit patterns of at least one of the surfaces include input/output terminals for the package, which are in electrical communication through the various package elements to the chip. The terminals may include conductive balls, as in a BGA package, or exposed lands, as in a land grid array (LGA) package, among other possibilities. The encapsulating material covers the chip and the electrical connections. The circuit board further includes at least one lateral slot through the circuit board. The slot(s) may extend inward from an outer peripheral wall of the circuit board or, in the case where the circuit board includes a central aperture, may extend outward from the central aperture, or both. The one or more slots act to relieve stresses in the circuit board that are otherwise manifested in warpage. Such stresses can result from temperature cycling typically during the manufacturing process, the encapsulation process, and/or differing thermal expansion properties of the various materials of the package. Accordingly, the packages of the present invention exhibit little or no such warpage, and hence may be more easily and reliably mounted on a mother board, even where a plurality of the packages are stacked one on top of the other.

These and other aspects, features, and capabilities of the present invention will be clear from a reading of the following detailed description of the exemplary embodiments and the accompanying drawings.

BRIEF DESCRIPTION OF THE DRAWINGS

In the various drawings of the exemplary embodiments, similar features of the various embodiments typically have the same reference numbers.

DETAILED DESCRIPTION

The present application has relation to semiconductor packages and methods disclosed in U.S. patent applications Ser. Nos. 09/566,069, 09/574,541, 09/574,006 and 09/589,713, all of which applications are incorporated herein by reference in their respective entireties. The present invention may be applied to some or all of the semiconductor packages disclosed in those applications. Further, the assembly methods disclosed in those applications may be modified in accordance with the present invention.

Figure 1:
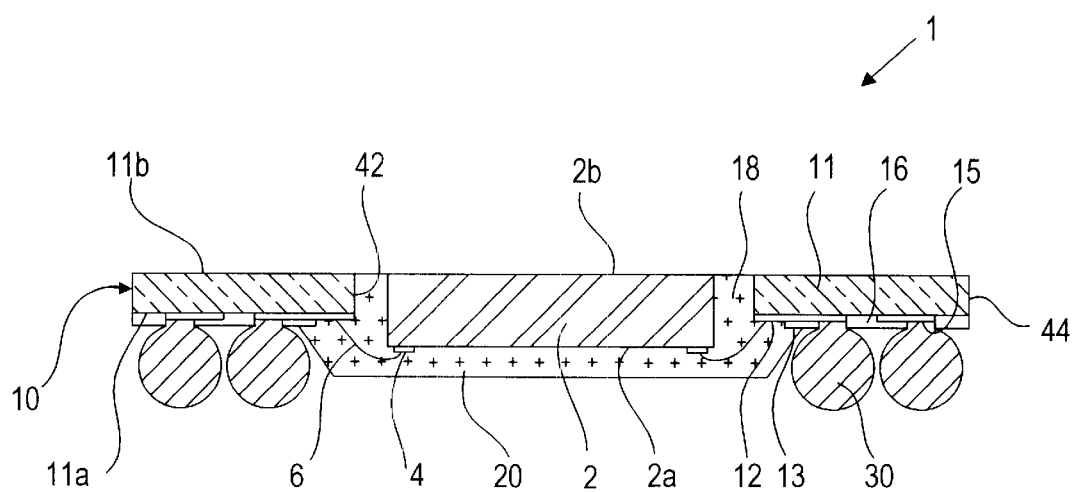
FIG. 1 is a cross-sectional side view of a BGA semiconductor package in accordance with one embodiment of the present invention.

FIG. 1 shows a semiconductor package 1 in accordance with one embodiment of the present invention. Semiconductor package 1 includes a rectangular semiconductor chip 2 having an active downward-facing first face 2a and an inactive upward-facing second face 2b First face 2a of semiconductor chip 2 includes a plurality of input/output pads 4 located adjacent to the four peripheral edges of first face 2a. Semiconductor chip 2 may be thinned by polishing inactive second face 2b.

Semiconductor chip 2 is within a rectangular through hole 18 that extends vertically through a central portion of an interconnective substrate, denoted herein as circuit board 10. Circuit board 10 is rectangular and has an orthogonal inner wall 42 around a central through hole 18 and an orthogonal peripheral outer wall 44. inner wall 42 and outer wall 44 each have four corners. Each corner of inner wall 42 is aligned with a corresponding corner of outer wall 44 (see FIG. 2A). Circuit board 10 is composed of a resin layer 11 having a downward-facing first face 11a with a layer of circuit patterns thereon, and an opposite upward-facing second face 11b. Through hole 18 has a greater area than first and second faces 2a and 2b of semiconductor chip 2 so that a gap is present between the peripheral sidewalls of semiconductor chip 2 and inner wall 42 of circuit board 10.

Resin layer 11 of circuit board 10 may be formed from BT (bismaleimide triazine) board, FR 4 board, FR 5 board, or a some other glass fiber filled organic (e.g., epoxy) laminate of the type used to make printed circuit board substrates for semiconductor packages.

The circuit patterns on first face 11a of resin layer 11 are electrically conductive, and each circuit pattern includes a bond finger 12 at an inner end proximate to through hole 18, a round ball land 15 at an opposite outer end, and a connection part 13 that extends between the bond finger 12 and opposing ball land 15. The circuit patterns may be formed of copper. Bond fingers 12 may be plated with gold or silver, and ball lands 15 may be plated with gold, silver, nickel or palladium, or combinations thereof, to facilitate connections thereto.

The circuit patterns on first face 11a of resin layer 11 are covered with a hardened insulative cover coat 16. Cover coat 16 may be formed from a polymer resin, such as an epoxy resin. Cover coat 16 protects the circuit patterns from external physical, chemical, electrical, and mechanical shocks. Bond fingers 12 and ball lands 15 are exposed for connections thereto through openings in cover coat 16.

Each input/output pad 4 of semiconductor chip 2 is electrically connected to one of the bond fingers 12 by a conductive connections means 6, which spans across through hole 18 between semiconductor chip 2 and the bond finger 12. As shown in FIG. 1, the conductive means 6 may be a bond wire formed of gold or aluminum. Alternatively, a lead extension may serve as connection means 6.

Semiconductor chip 2, through hole 18, connection means 6, and an inner portion of first face 11a of resin layer 11 of circuit board 10 around through hole 18, including bond fingers 12, are encapsulated within an insulative, protective encapsulant 20. Encapsulant 20 may be formed by molding and curing a resin material (e.g., epoxy), or by pouring and curing a liquid resin material (e.g., epoxy). The peripheral portion of first face 11a of resin layer 11 of circuit board 10 is not covered by encapsulant 20 in this embodiment. In addition, encapsulant 20 covers first face 2a and the peripheral sidewalls of semiconductor chip 2, but does not cover second face 2b of semiconductor chip 2 or second face 11b of resin layer 11 of circuit board 10. The encapsulant 20 attaches chip 2 to circuit board 10.

Plural conductive balls 30 made of lead tin solder or some other metal are fused to ball lands 15, and serve as input/output terminals for semiconductor package 1. (The term "conductive ball" is used broadly herein to include bump-shaped input/output terminals.) Balls 30 are each electrically connected to a respective input/output pad 4 of semiconductor chip 2 through connection means 6, bond finger 12, connection part 13, and ball land 15. Balls 30 allows semiconductor package 1 to be mounted on a motherboard (not shown). Since second face 2b of semiconductor chip 2 is exposed out of encapsulant 20, heat may easily radiate from semiconductor chip 2. Other configurations of input/output terminals are possible, as practitioners will appreciate.

First face 2a of semiconductor chip 2, first face 11a of circuit board 10, and conductive balls 30 are oriented in a common downward direction. Second face 2b of semiconductor chip 2 and second face 11b of resin layer 11 are in a common horizontal plane, thereby achieving a thin semiconductor package.

An optional conductive ring (not shown) may be formed on second face 11b of circuit board 10 around through hole 18. The ring may be electrically connected by a via (not shown) through resin layer 11 to a circuit pattern on first face 11a of circuit board 10. A conductive ink or other conductive material (not shown) may be applied between second face 2b of semiconductor chip 2 and the conductive ring, thereby electrically connecting second face 2b to the conductive ring. Accordingly, a voltage (e.g., ground) may be applied to second face 2b of chip 2.

In the embodiment of FIG. 1, the warpage problem mentioned above is avoided, or at least mitigated, by the provision of at least one slot vertically through the circuit board. The slot or slots relieve stresses in the circuit board that otherwise would be manifested by warpage.

Figure 2A:
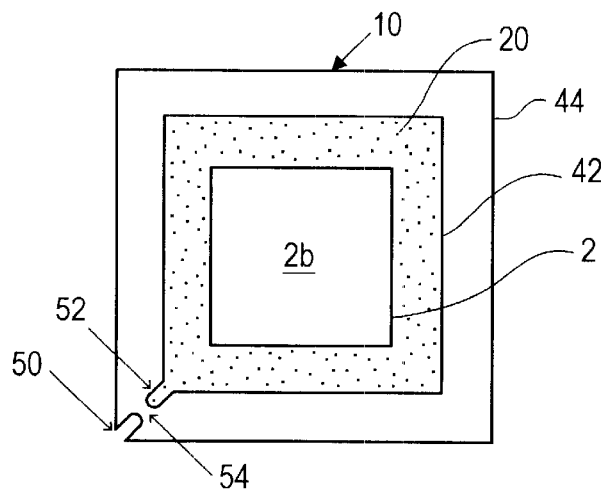
FIGS. 2A, 2B, and 2C are top plan views showing alternative circuit board substrates for the package of FIG. 1

FIG. 2A is a top plan view of semiconductor package 1. In this embodiment, there is no ground ring. As shown, circuit board 10 includes a pair of aligned diagonal slots between adjacent inner and outer corners of circuit board 10. The slots act to relieve stresses in circuit board 10, thereby preventing, or at least mitigating, the warpage mentioned above. In particular, an inner slot 52 begins at a corner of inner wall 42 of through hole 18 and extends diagonally outward toward the corresponding outer corner of circuit board 10. Inner slot 52 is filled with encapsulant 20. The outward flow of the encapsulant material was stopped during the molding or other encapsulation step by an intact portion of circuit board 10, denoted as stop 54. An outer slot 50 extends diagonally inward from the adjacent outer corner of outer wall 44 toward stop 54 and inner slot 52. Outer slot 50 is aligned with inner slot 52, and stop 54 is between them. Slots 50 and 52 are located in regions where there are no circuit traces that are necessary for the electrical functioning of the finished semiconductor package 1. Having the slots 50, 52 allows for a package substrate that is free, or substantially free, of warpage, even where the area of the package is large.

Figure 2B:
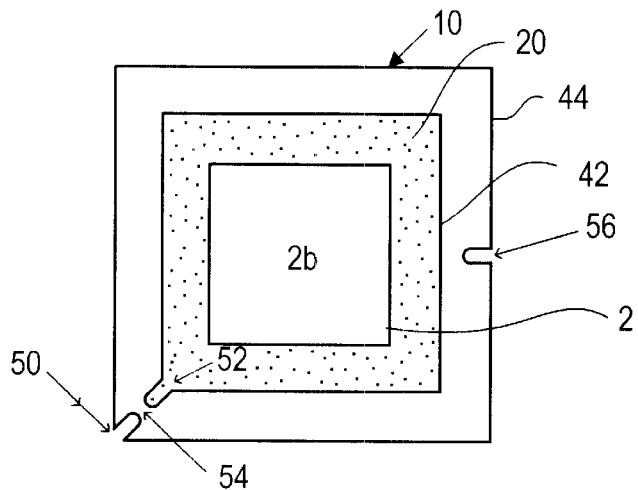

FIG. 2B is a top plan view of another embodiment of semiconductor package 1 in accordance with the present invention. The sole difference between this embodiment and the embodiment of FIG. 2A is that an additional slot, denoted as side slot 56, is formed vertically through circuit board 10 at a mid-point of one of the rectilinear sides of outer wall 44. Side slot 56 extends only part of the way across circuit board 10, e.g., half of the distance between outer wall 44 and inner wall 42. Side slot 56 is perpendicular to outer wall 44 in this embodiment. Inner slot 52, outer slot 50, and side slot 56 act to relieve stresses in circuit board 10 that otherwise would cause warpage of circuit board 10.

Figure 2C:
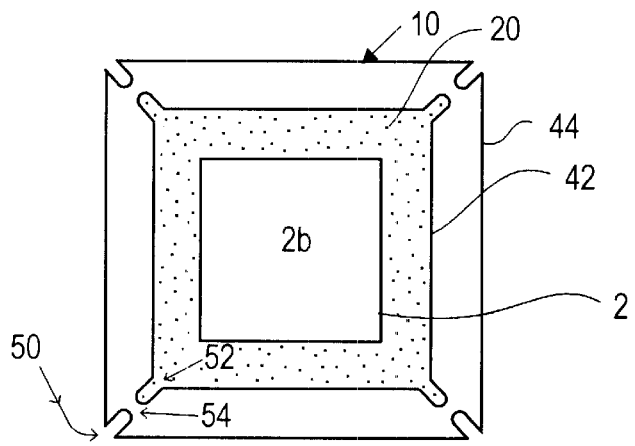

FIG. 2C is a top plan view of another embodiment of semiconductor package 1 in accordance with the present invention. The sole difference between this embodiment and the embodiment of FIG. 2A is that there are four pairs of inner slots 52 and outer slots 50. In particular, an inner slot 52 and an outer slot 50 are provided in a linear diagonal alignment between each of the four pairs of inner and outer corners of circuit board 10. Again, the inner slots 52 and outer slots 50 act to relieve stresses in circuit board 10 that otherwise would result in warpage of circuit board 10. One or more side slots 56, as shown in FIG. 2B, also may be provided in the embodiment of FIG. 2C.

Practitioners will appreciate that a slot or slots formed through the circuit board 10 for relieving stress in the circuit board may have a variety of different configurations, and may be located at various positions around circuit board 10 between inner wall 42 and outer wall 44. The embodiments of FIGS. 2A, 2B, and 2C are exemplary only.

Further, such a slot or slots may be used with a variety of package configurations, including those described in the patent applications mentioned above. Generally, such a slot or slots may be formed as a stress relief in any package substrate that is subject to warpage. For example, such a slot or slots may be formed through a printed circuit board substrate for a BGA or LGA package that includes a central aperture within which the chip is supported by a molded encapsulant material.

Figure 3:
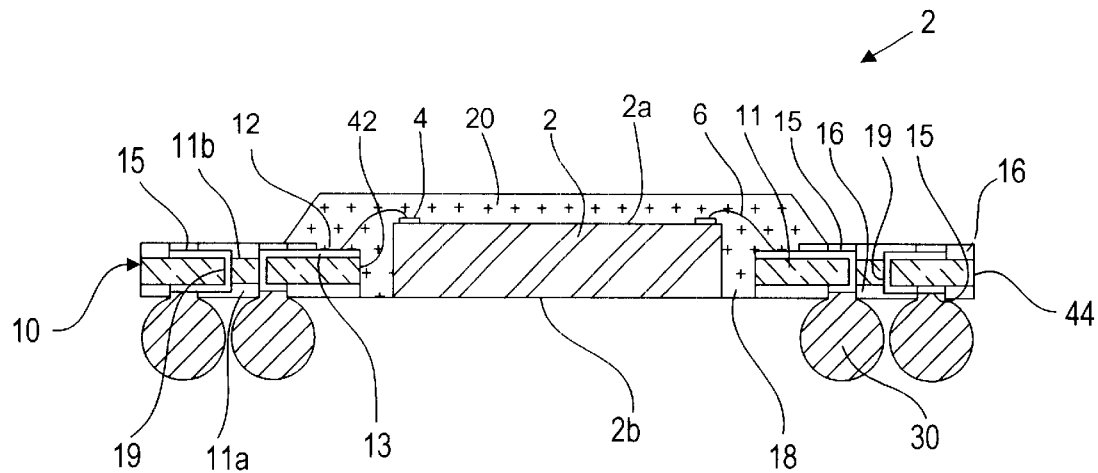
FIG. 3 is a cross-sectional side view of a stackable BGA semiconductor package in accordance with another embodiment of the present invention.

For example, FIG. 3 shows a stackable semiconductor package 2 in accordance with another embodiment of the present invention. Semiconductor package 2 is similar to semiconductor package 1, and has common features, except as follows. First, semiconductor chip 2 of package 2 is inverted by comparison to semiconductor chip 2 of FIG.1, so that first surface 2a of chip 2 has an upward orientation and second surface 2b of chip 2 is exposed in a horizontal plane with first surface 11a of resin layer 11 of circuit board 10. Second, a layer of conductive circuit patterns (e.g., copper circuit patterns) is formed on upper second surface 11b of resin layer 11 as well as on first surface 11a Ball lands 15 of the upper layer of circuit patterns are exposed through apertures in a cover coat 16 that is on upper second surface 11b of resin layer 11. Third, conductive metal-lined vias 19 electrically connect the upper and lower layers of circuit patterns, so that the ball lands 15 on second surface 11b are electrically connected to chip 2 and to the ball lands 15 and balls 30 on lower first surface 11a of circuit board 10. With such a configuration, a second semiconductor package 2 (or some other compatible package) can be stacked onto the upper second surface 11b of circuit board 10 of a lower package 2 that is mounted (or mountable) on a mother board, thereby forming a stack of packages. The conductive balls 30 of the upper package 2 can be fused to the ball lands 15 on the upper second surface 11b of the lower package 2 in order to electrically connect the two stacked packages.

Figure 4:
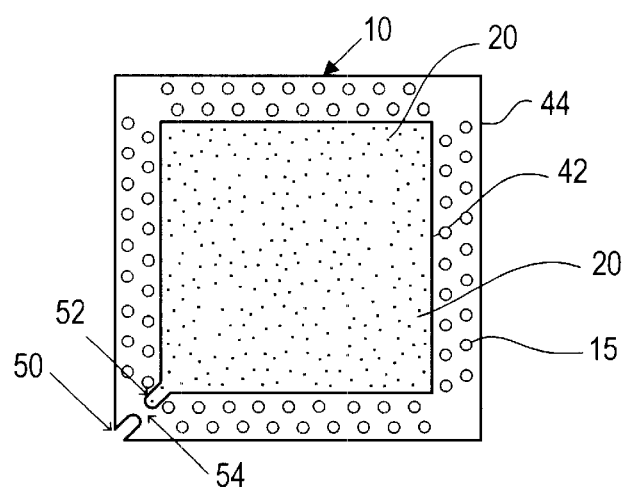
FIG. 4 is a top plan view showing an exemplary circuit board substrate for the package for FIG. 3.

FIG. 4 is a top plan view of semiconductor package 2 of FIG. 3. As shown, circuit board 10 includes an inner slot 52 and an aligned outer slot 50, as discussed above with respect to FIG. 2A, for relieving stresses in circuit board 10 that otherwise could lead to warpage. Of course, other configurations of a slot or slots through circuit board 10 of semiconductor package 2 are possible (e.g., similar to FIGS. 2B and 2C).

Figure 5:
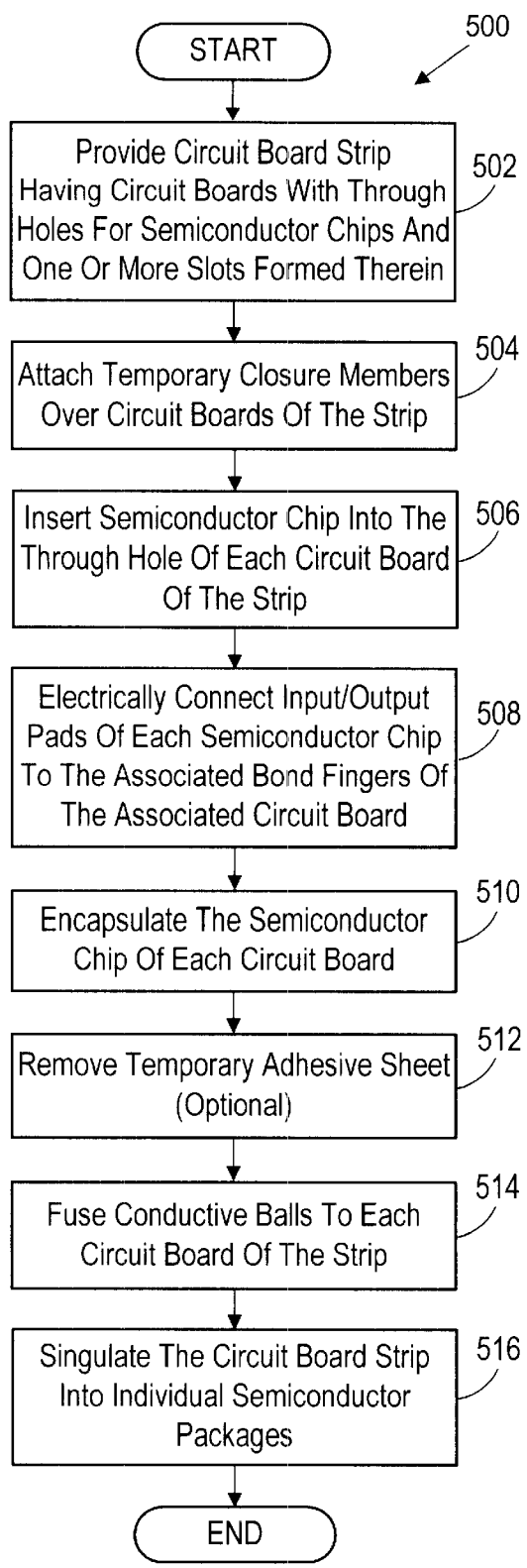
FIG. 5 is a flow chart illustrating a method of making a semiconductor package in accordance with an embodiment of the present invention.

FIG. 5 is a flow chart illustrating a semiconductor fabrication method 500 in accordance with another embodiment of the present invention. Method 500 allows the fabrication of a plurality of semiconductor packages. For the sake of example, method 500 will be described in the context of semiconductor package 1 of FIGS. 1 and 2C, although the method may be employed, with appropriate modifications, to make the packages of FIGS. 2A, 2B, 3, and 4, among other possibilities.

Figure 6:
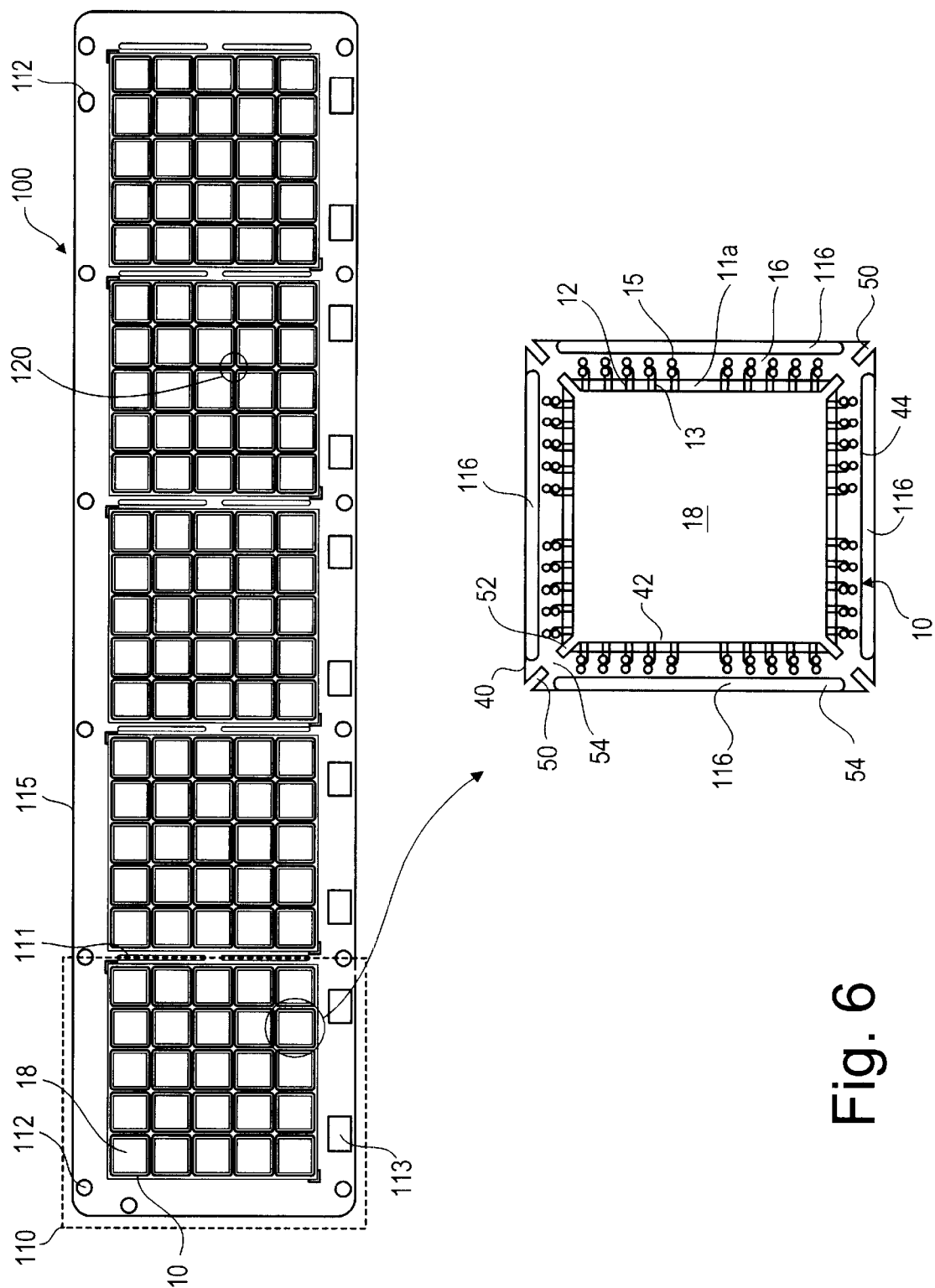
FIG. 6 is a top plan view of a circuit board strip that may be used for making a plurality of semiconductor packages like that of FIG. 1.

In step 502, a circuit board strip for making a plurality of packages is provided. FIG. 6 is a top plan view of an exemplary circuit board strip 100 that may be used for making a plurality of semiconductor packages 1 of FIG. 1. Strip 100 includes a main strip 115 composed of five substrips 110. Each substrip 110 includes a matrix of twenty-five interconnected circuit boards 10, each of which is perforated with a rectangular through hole 18. A pair of slots 111 is provided at the right of each substrip 110 between adjacent substrips 110. Slots 111 may be used as punch-throughs to help remove the closure member discussed below. Opposing rows of holes 112 are formed through the opposing peripheral portions of main strip 115. Holes 112 allow for the alignment and advancement of strip 100 in automatic processing equipment.

Conductive ground planes 113 also are formed on the peripheral portions of main strip 115. Ground planes 113 may be formed on both sides of main strip 115. Busses may extend between ground planes 113 and circuit patterns of each circuit board 10. Ground planes 113 are adapted to contact grounded metal manufacturing equipment (e.g., a mold assembly) during the manufacturing process, and thus serve as a path to ground for the discharge of static electricity.

FIG. 6 includes an enlarged view of part of one of the circuit boards 10 of a substrip 110 of strip 100. The enlarged view shows a first face 11a of the resin layer 11 of the circuit board 10, on which bond fingers 12, connection parts 13, and ball lands 15 are provided. The number and arrangement of such circuit patterns will vary with the application and the package size.

Around each circuit board 10 of FIG. 6 are four open slots 116. A slot 116 is adjacent to each of the four rectilinear sides of each circuit board 10. The corners of each circuit board 10 are connected to the corners of adjacent circuit boards 10 by a temporary bridge 40 (see FIG. 7), which is defined by the converging ends of four slots 116. Slots 116 also define outer wall 44 of circuit board 10.

Figure 7:
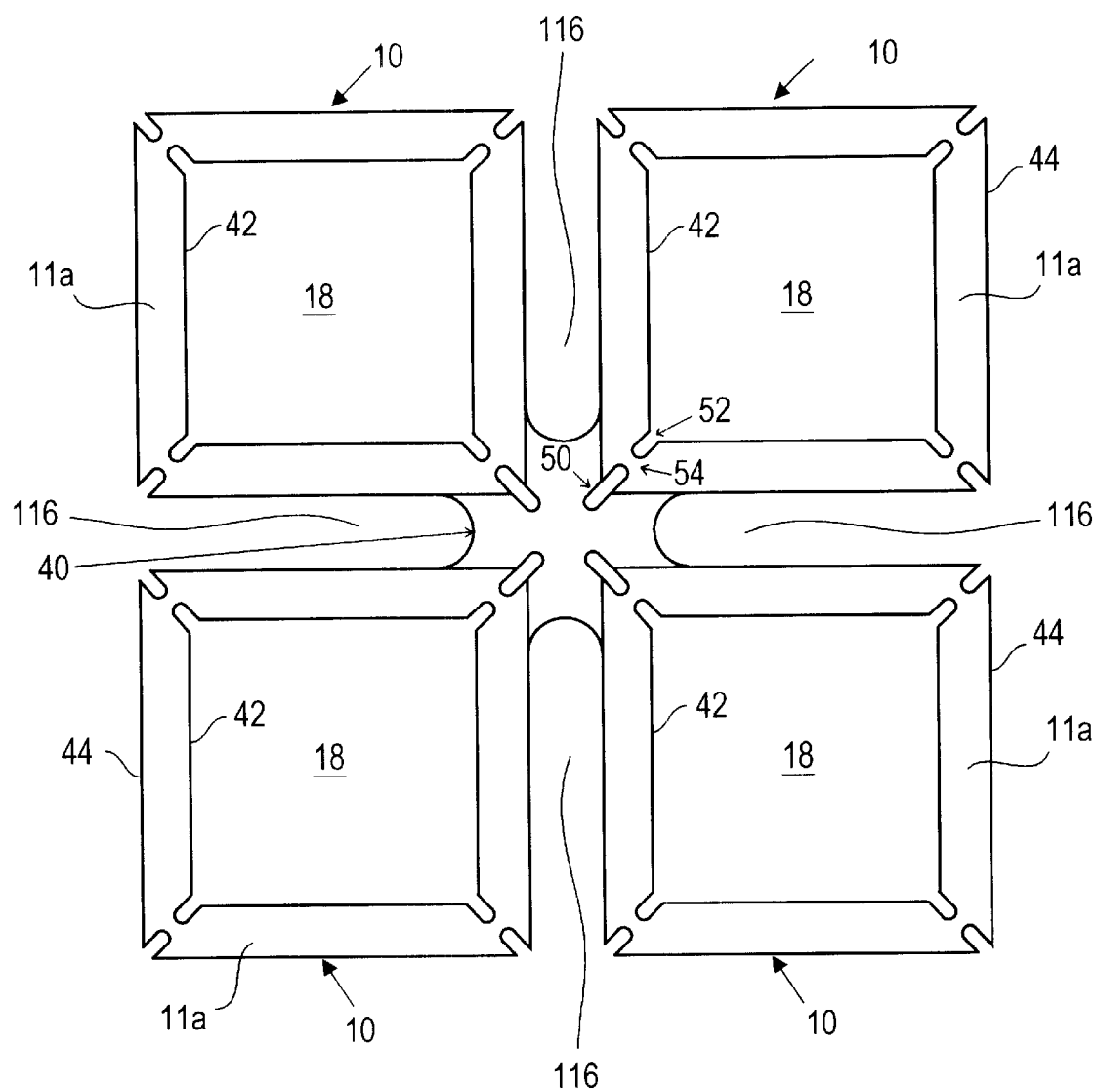
FIG. 7 is a top plan view of four joined circuit boards of the circuit board strip of FIG. 6.

FIG. 7 is a top plan view of first surface 11a of resin layer 11 of four adjacent circuit boards 10 of a substrip 110 of strip 100. For ease of view, the circuit patterns are omitted. In accordance with an embodiment of the present invention, an inner slot 52 and an outer slot 50 are provided vertically through circuit board 10 at each of the four pair of inner and outer corners of each circuit board 10, as in FIG. 2C. The inner slot 52 extends diagonally from an inner corner of inner wall 42 toward a corresponding outer corner of circuit board 10, where temporary bridge 40 is located. Inner slot 42 extends only part of the distance across circuit board 10. In addition, an outer slot 50 extends diagonally inward along the same line as inner slot 52 from bridge 40 toward through hole 18. Outer slot 50 extends only part of the distance across circuit board 10 from bridge 40 to inner slot 52. Stop 54 separates the juxtaposed ends of inner slot 52 and outer slot 50. Stop 54 provides structural support for circuit board 10 and acts like a dam bar to stop the outward flow of encapsulant during the molding or other encapsulation step. Slots 116, 52 and 50 can be formed in numerous ways, such as by the use of a punch or laser.

In step 504 of method 500 of FIG. 5, one or more temporary adhesive closure members (not shown) are attached to second surface 11b (see FIG. 1) of resin layer 11 of each circuit board 10 of circuit board strip 100 so that each through hole 18 of strip 100 is covered. One closure member may be applied over the entire main strip 115, or separate closure members may be applied over each substrip 110, thereby covering all of the through holes 18. An ultraviolet or heat sensitive tape or a metal tape may be used as the closure member.

In step 506, a semiconductor chip 2 is inserted into the through hole 18 of each circuit board 10 of circuit board strip 100 (see FIG. 1). The chip 2 is adhesively placed on the portion of the closure member that spans the respective through hole 18. Each chip 2 is placed in such a fashion that its input/output pads 4 are oriented in the same direction as first surface 11a and bond fingers 12 of circuit board 10 (see FIGS. 1 and 6).

In step 508, each input/output pad 4 of each semiconductor chip 2 is electrically connected to an associated bond finger 12 of the respective circuit board 10. The electrical connection is made via connection means 6 (see FIG. 1). Connection means 6 can be any type of conductor, such as a gold or aluminum wire or a lead.

In step 510, a separate housing of an insulative encapsulant material is provided over each of the chips 2 of strip 100. Referring to FIG. 1, encapsulant 20 may be formed by molding or pouring a resin compound (e.g., epoxy). Encapsulant 20 fills through hole 18 and inner slots 50, and also covers connection means 6 and a portion of first surface 11a of resin layer 11 of each of the circuit boards 10 of strip 100 (see FIGS. 1, 6, 7). Encapsulant 20 is subsequently cured.

In step 512, the temporary closure member may be removed, since the hardened encapsulant 20 attaches chip 2 to circuit board 10.

In step 514, a plurality of conductive balls 30 are fused on the ball lands 15 on first surface 11a of resin layer 11 of each circuit board 10 of strip 100 (see FIGS. 1 and 6). A conventional process for forming the conductive balls 10 may be used. Of course, the form of such input/output terminals is a matter of choice. For example, balls 30 may be omitted.

In step 516, the connections between the circuit boards 10 of circuit board strip 100 are severed using a punch, saw, laser, or the like that cuts temporary bridges 40 (see FIGS. 6 and 7). Step 514 singulates a plural of semiconductor packages 1 of FIGS. 1 and 2C.

Of course, the above process is easily modified to make the packages of FIGS. 2A and 2B by changing the number and location of stress-relief slots formed through each circuit board 10. As another example, semiconductor package 2 of FIGS. 3 and 4 may be made by providing a circuit board strip 100 having circuit patters on both first surface 11a and second surface 11b of each circuit board 10.

The present invention provides, among other things, circuit boards and semiconductor packages that are not susceptible, or are less susceptible, to the warpage that is seen in conventional packages. This allows, among other things, a more reliable package and a more reliable connection with a mother board or another package in a stack of packages. Packages may be increased in area without the limitation imposed by such warpage.

While particular exemplary embodiments have been shown and described, it will be apparent to practitioners that various changes and modifications may be made without departing from this invention in its broader aspects. Accordingly, the appended claims encompass all such changes and modifications as fall within the scope of this invention.

What is claimed is:

1. A semiconductor package comprising:
   a circuit board having circuit patterns on at least a first surface of the circuit board and a central aperture through the circuit board;
   a semiconductor chip within the central aperture and electrically connected to the circuit patterns of said circuit board, wherein the circuit board includes at least one slot through the circuit board and an outer peripheral wall, and at least one said slot extends inward from the outer peripheral wall;
   a hardened encapsulant material in said central aperture and covering the semiconductor chip and at least a portion of the circuit board.

2. The semiconductor package of claim 1, wherein the outer peripheral wall of the circuit board includes a corner, and the at least one slot extends inward from said corner.

3. The semiconductor package of claim 1, wherein the circuit board includes a plurality of the slots, the outer peripheral wall includes a plurality of corners, and at least one of the slots extends inward from each of a plurality of the corners.

4. The semiconductor package of claim 1, wherein at least one slot extends outward from the central aperture.

5. The semiconductor package of claim 1, wherein the circuit board includes a plurality of the slots, and at least one said slot extends outward from the central aperture.

6. The semiconductor package of claim 1, wherein a pair of the slots are aligned between a corner of said outer peripheral wall and a corresponding corner of the central aperture.

7. The semiconductor package of claim 1, wherein the central aperture includes a plurality of first corners and the outer peripheral wall includes a plurality of second corners each corresponding to a first corner, and a pair of aligned slots extend between each first corner and the corresponding second corner.

8. A circuit board strip for making a plurality of semiconductor packages comprising:
   an array of circuit boards each containing conductive circuit patterns on at least one surface thereof, and a central aperture adapted for placement of a semiconductor chip therein,
   wherein each circuit board of the array includes at least one slot through the circuit board extending inward from an outer peripheral wall of the circuit board, said at least one slot being located so that the semiconductor package made using the circuit board includes said at least one slot.

9. The circuit board strip of claim 8, wherein the at least one slot of the circuit board extends outward from the central aperture.

10. The circuit board strip of claim 8, wherein the circuit board includes a plurality of the slots, at least one slot extends outward from the central aperture, and at least one slot extends inward from an outer peripheral wall of the circuit board.

11. The circuit board strip of claim 8, wherein each circuit board includes an outer peripheral wall, and a pair of the slots are aligned between at least one corner of the central aperture and a corresponding corner of the outer peripheral wall.

12. The circuit board strip of claim 8, wherein the circuit board includes a second surface opposite the first surface, said second surface includes circuit patterns, and at least some of the circuit patterns of the second surface are electrically connected through the circuit board to circuit patterns on the first surface of the circuit board.

13. The circuit board strip of claim 8, wherein each circuit board of the array is separated from at least one other adjacent circuit board of the array by a slot through the circuit board.

14. A semiconductor package comprising:
   a substrate having metalizations on at least a first surface of the substrate, a central aperture through the substrate, and a slot extending inwardly toward the central aperture from a periphery of the substrate;

a semiconductor chip within the central aperture and electrically connected to the metalizations of said substrate; and a hardened encapsulant material in said central aperture and covering the semiconductor chip and at least a portion of the substrate.

15. The semiconductor package of claim 14, wherein the substrate includes a second slot extending inwardly from the periphery of the substrate.

16. The semiconductor package of claim 15, wherein the slot and the second slot are aligned.

17. The semiconductor package of claim 15, wherein the slot and the second slot are between aligned corners of the central aperture and a perimeter of the substrate.

18. A semiconductor package:

a circuit board having conductive patterns on at least a first surface of the circuit board and a central aperture through the circuit board;

a semiconductor chip within a central aperture of the circuit board and electrically connected to the circuit patterns of said circuit board, wherein the circuit board includes at least one linear slot through the circuit board; and a hardened encapsulant material covering the semiconductor chip and at least a portion of the circuit board.

19. The semiconductor package of claim 18, wherein the circuit board includes an outer peripheral wall, and said at least one linear slot extends inward from the outer peripheral wall.

20. The semiconductor package of claim 18, wherein the outer peripheral wall of the circuit board includes a corner, and the at least one slot extends inward from said corner.

21. The semiconductor package of claim 18, wherein the circuit board includes said outer peripheral wall and a plurality of the linear slots, the outer peripheral wall includes a plurality of corners, and at least one of the linear slots extends inward from each of a plurality of the corners.

22. The semiconductor package of claim 18, wherein a pair of the linear slots are aligned between a corner of said outer peripheral wall and a corresponding corner of the central aperture.

23. The semiconductor package of claim 18, wherein the central aperture includes a plurality of first corners, and the outer peripheral wall includes a plurality of second corners each corresponding to a first corner, and a pair of aligned said slots extend between each first corner and the corresponding second corner.

* * * * *